US006762939B2

(12) United States Patent
Summers et al.

(10) Patent No.: US 6,762,939 B2
(45) Date of Patent: Jul. 13, 2004

(54) THERMAL SOLUTION FOR A MEZZANINE CARD

(75) Inventors: Mark D. Summers, Phoenix, AZ (US); Javier Leija, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/079,181

(22) Filed: Feb. 20, 2002

(65) Prior Publication Data

US 2003/0156386 A1 Aug. 21, 2003

(51) Int. Cl.[7] .................................................. H05K 7/20
(52) U.S. Cl. ..................... 361/719; 361/687; 361/737; 165/80.3; 165/165; 257/707
(58) Field of Search ..................... 365/51, 52, 63; 257/707, 706, 713, 717; 454/184; 165/80.3, 185; 361/737, 687, 690, 692, 704, 705, 707–712, 715, 717–719

(56) References Cited

U.S. PATENT DOCUMENTS

| | | | |
|---|---|---|---|
| 6,043,983 A | | 3/2000 | Taylor et al. |
| 6,064,575 A | * | 5/2000 | Urda et al. ................. 361/721 |
| 6,163,474 A | | 12/2000 | Prasanna et al. |
| 6,219,243 B1 | | 4/2001 | Ma et al. |
| 6,246,582 B1 | * | 6/2001 | Habing et al. .............. 361/704 |
| 6,377,462 B1 | * | 4/2002 | Hajicek et al. ............. 361/719 |
| 6,392,891 B1 | * | 5/2002 | Tzlil et al. ................... 361/719 |
| 6,442,033 B1 | * | 8/2002 | Liu et al. .................... 361/743 |
| 6,483,702 B1 | * | 11/2002 | Lofland ....................... 361/704 |
| 2002/0172010 A1 | * | 11/2002 | Sarno | |

FOREIGN PATENT DOCUMENTS

FR 2803166 * 6/2001

OTHER PUBLICATIONS

*Draft Standard Physical and Environmental Layers for PCI Mezzanine Cards: PMC*; Sponsored by the Microprocessor & Microcomputer Standards Committee (MMSC) of the IEEE Computer Society P1386.1/Draft 2.4; Jan. 12, 2001, pp. 1–10.
Draft Standard for a Common Mezzanine Card Family: CMC; Sponsored by the Microprocessor & Microcomputer Standards Committee (MMSC) of the IEEE Computer Society P1386/Draft 2.4a; Mar. 12, 2001, pp. 1–49.

* cited by examiner

*Primary Examiner*—Michael Datskovsky
(74) *Attorney, Agent, or Firm*—Blakely, Sokoloff, Taylor & Zafman LLP

(57) ABSTRACT

A bottom heat dissipating device may be attached to a bottom surface of a printed circuit board (PCB). A top surface of the bottom heat dissipating device may be thermally coupled with a backside surface of one or more electronic components mounted on the bottom surface of the PCB. A top heat dissipating device may be attached to a top surface of the PCB. The top heat dissipating device may be thermally coupled with the bottom heat dissipating device through a thermally conductive coupling member to provide a conductive path for heat transfer from the bottom heat dissipating device to the top heat dissipating device. An opening adjacent to an edge of the thermally conductive coupling member may allow air flow between the top and bottom heat dissipating devices. The PCB may be part of a mezzanine card, such as a Peripheral Component Interconnect (PCI) mezzanine card (PMC).

22 Claims, 9 Drawing Sheets

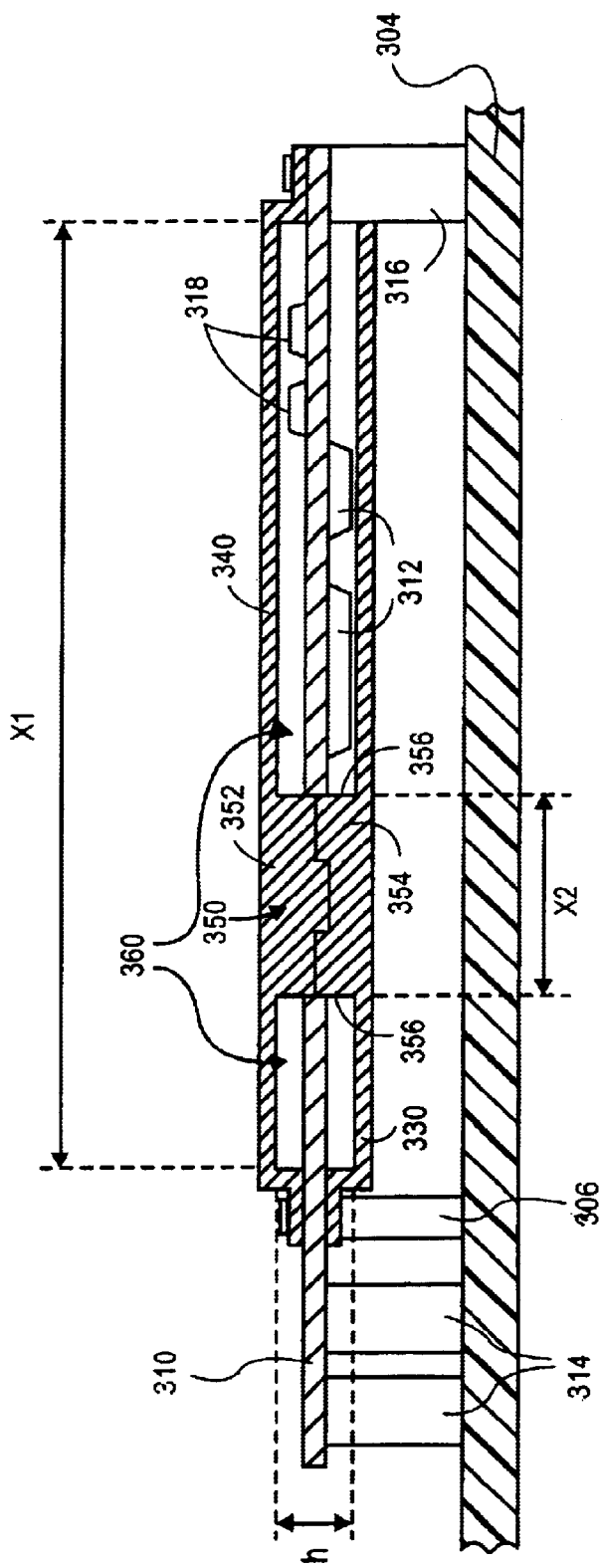
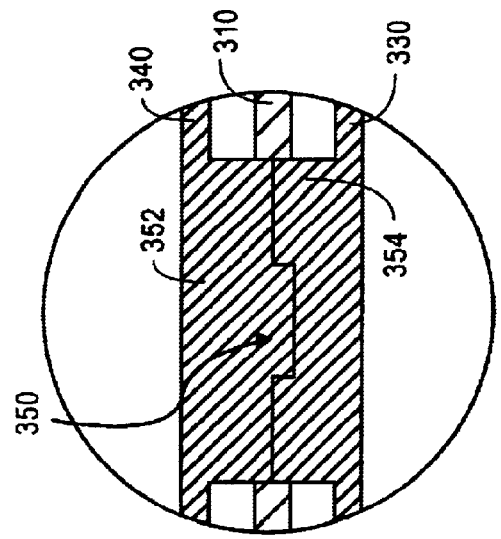
FIG. 3A
FIG. 3B

THERMAL SOLUTION FOR A MEZZANINE CARD

FIELD OF THE INVENTION

The present invention relates to printed circuit board (PCB) package technology and more particularly to a method and apparatus for removing heat from a PCB.

BACKGROUND OF THE INVENTION

Mezzanine cards allow for a variety of optional functional expansions for a host computer system, such as network interfacing, modem communications and security co-processing. Mezzanine cards may even contain a main processor for the host system. Typically, a mezzanine card is connected to a carrier board of the host system using the Peripheral Component Interconnect (PCI) bus for electrical interconnections. Because mezzanine cards typically mount horizontally to the carrier board, they may require less space than traditional PCI expansion cards that mount vertically, at a right angle to a motherboard. Thus, mezzanine cards may be used in applications requiring relatively small enclosures, such as set top boxes and internet appliances.

FIG. 1 illustrates an exemplary embodiment of a mezzanine system according to the prior art, comprising a mezzanine card 100 mounted on a carrier board 104 by standoffs 106. The mezzanine card 100 may comprise a printed circuit board (PCB) 110 having electronic components 112 mounted on a bottom surface of the mezzanine card 100. PCI bus connections may be made with connectors 114, which may mount with corresponding connectors (not shown) on the carrier board. The carrier board may be mounted in an enclosure 120 which may have a faceplate 122 with an opening 124 to receive a bezel 116 of the mezzanine card 100. A connector 118 may be attached to the bezel 116 to provide an interface to the mezzanine card 100, such as an Ethernet network connection.

Typically, the majority of electronic components of a mezzanine card are mounted on the bottom surface of the PCB. Because the electronic components may generate a substantial amount of heat, a heat dissipating device, such as a bottom heat spreader 130, may be mounted on the bottom surface of the PCB 110 to transfer heat from the electronic components which may then be dissipated into the air. However, the surface area of the bottom heat spreader 130 may not be sufficient to adequately cool the mezzanine card 100. Therefore, one of the challenges facing designers is to provide a thermal solution with an increased dissipative surface area. However, physical dimensions of the mezzanine card 100 may be defined by a standard that specifies a volumetric envelope through which no components may protrude. Therefore, another challenge facing designers is to ensure the thermal solution fits within a standard volumetric envelope.

BRIEF DESCRIPTION OF THE DRAWINGS

FIGS. 3A and 3B illustrate side views of an exemplary embodiment of a mezzanine card including a coupling member, according to one embodiment of the present invention;

DETAILED DESCRIPTION

The following detailed description sets forth an embodiment or embodiments in accordance with the present invention. In the following description, numerous specific details are set forth such as material types, dimensions, and ranges, in order to provide a thorough understanding of the present invention. However, it will be obvious to one of skill in the art, that the invention may be practiced without these specific details. In other instances, well-known elements and processing techniques have not been shown in particular detail in order to avoid unnecessarily obscuring the present invention.

Some embodiments of the present invention provide a method and apparatus to remove heat from a printed circuit board (PCB) by a combination of conduction and convection. A bottom heat dissipating device may be thermally coupled with one or more electronic devices mounted on a bottom surface of the PCB. A top heat dissipating device may be thermally coupled with the bottom heat dissipating device through a thermally conductive coupling member to provide a conductive path for heat transfer from the bottom heat dissipating device to the top heat dissipating device. The additional dissipative surface area of the top heat dissipating device may assist in removing heat from the PCB. Openings adjacent to the coupling member may allow air flow between the top and bottom heat dissipating devices, which may further assist in removing heat from the PCB by convection.

Figure 1:
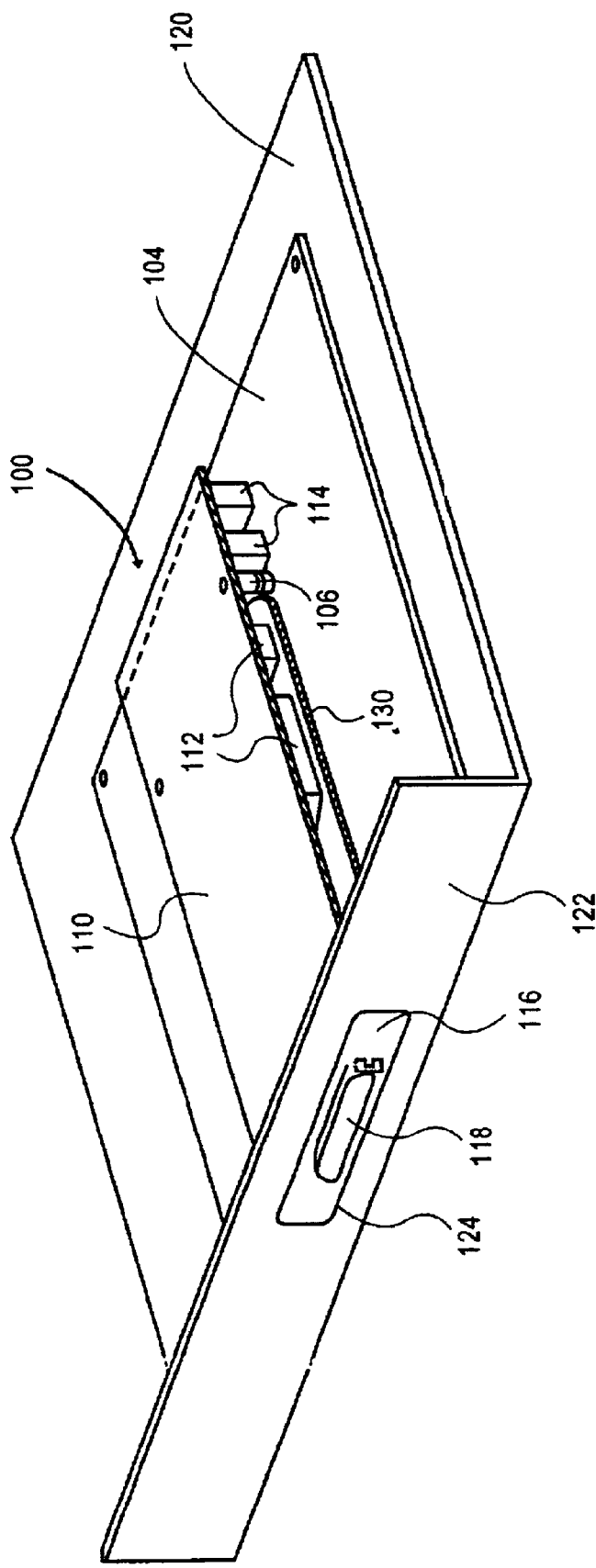
FIG. 1 illustrates an exemplary mezzanine system and mezzanine card according to the prior art.
Figure 2:
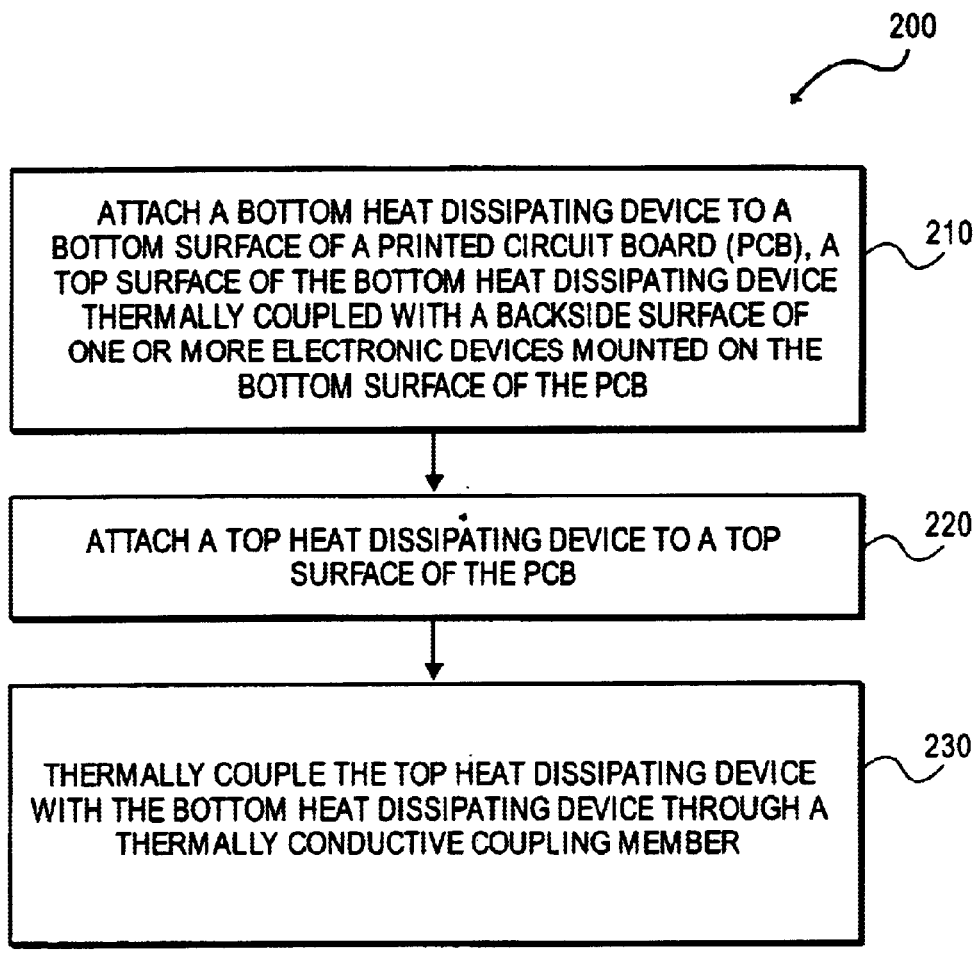
FIG. 2 illustrates a flow diagram of an exemplary method according to one embodiment of the present invention.

FIG. 2 is a flow diagram 200 illustrating exemplary operations of a method to remove heat from a PCB according to one embodiment of the present invention. The operations of FIG. 2 may be described with reference to the exemplary embodiments of FIGS. 3 and 4, which illustrate an exemplary mezzanine card 300 and an exploded view of the exemplary mezzanine card 300, respectively. However, it should be understood that performing the exemplary operations of FIG. 2 may result in embodiments other than the exemplary embodiments of FIGS. 3 and 4. For example, the operations of FIG. 2 may be applied to other mezzanine cards, and generally, to other types of PCB assemblies.

For block 210, a bottom heat dissipating device is attached to a bottom surface of a PCB, a top surface of the bottom heat dissipating device thermally coupled with a backside surface of one or more electronic components mounted on the bottom surface of the PCB. The bottom heat dissipating device may be any suitable heat dissipating device, such as a heat sink, thermal plate, or heat spreader.

For example, with reference to the exemplary mezzanine card 300 of FIG. 3, a bottom heat spreader 330 may be attached to a bottom surface of a PCB 310, with a top surface of the bottom heat spreader 330 thermally coupled with a backside surface of one or more electronic components 312 mounted on the bottom surface of the PCB 310. The mezzanine card 300 may be mounted on a carrier board 304 with mounting hardware, such as standoffs 306 and a bezel 316, with the bottom heat spreader 330 facing the carrier board 304. Electrical interconnections between the mezzanine card 300 and the carrier board 304 may be made through connectors 314, which may provide PCI bus interconnections to the mezzanine card 300.

The electronic components 312 may comprise any suitable electronic components to perform a desired function of the mezzanine card 300, such as network interfacing or digital signal processing (DSP). For one embodiment of the present invention, the electronic components 312 may comprise a processor, a chipset such as a memory controller chipset, and/or a memory.

For one embodiment of the present invention, a thermal interface material (TIM) may be disposed between a backside surface of the one or more electronic components 312 and the top surface of the bottom heat spreader 330 in an effort to enhance heat transfer. For example, a thermal pad 432, illustrated in the exploded view of FIG. 4, may be disposed between the top surface of the bottom heat spreader 330 and the backside surface of the electronic components 312. Other types of suitable TIMs may also be used, such as thermal greases, thermal adhesives, and thermal gels.

Figure 5:
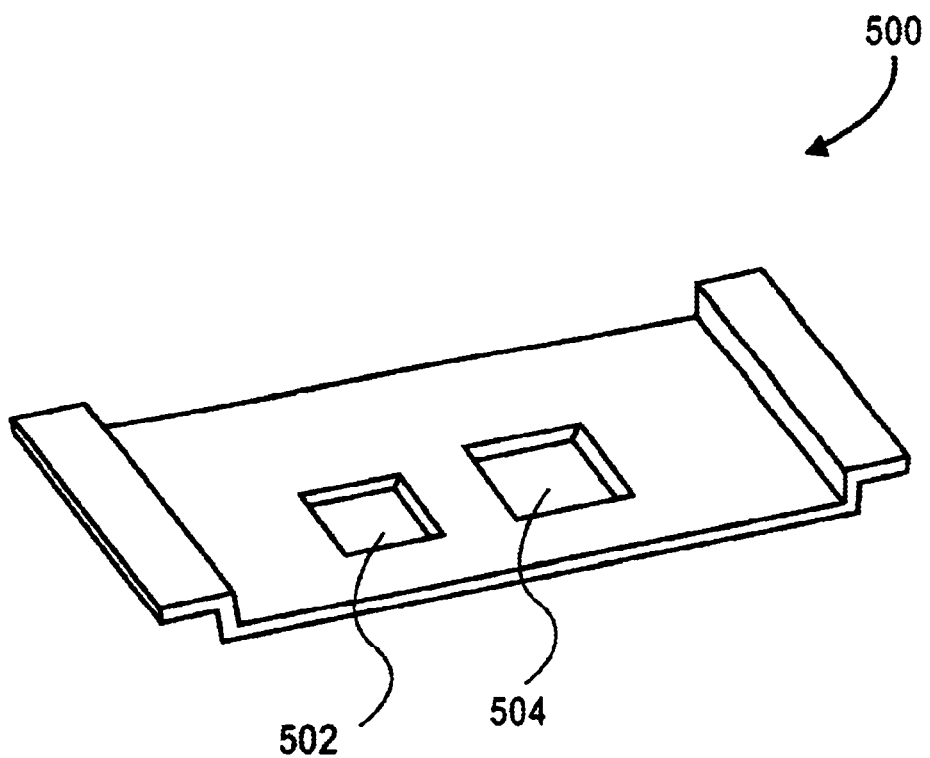
FIG. 5 illustrates a top view of an exemplary embodiment of a heat spreader according to one embodiment of the present invention.

The bottom heat spreader 330 may be made of any suitable thermally conductive material, such as a metal or a thermally conductive composite material. For example, the bottom heat spreader 330 may be made of copper, a copper alloy, aluminum, or an aluminum alloy. The bottom heat spreader may be formed from a relatively inexpensive sheet metal. The bottom heat spreader may be formed with surface area increasing features, such as fins. As illustrated in FIG. 5, for one embodiment of the present invention, the bottom heat spreader may have recessed areas 502 and 504 having different depths to thermally couple with electronic components having different heights.

For block 220 of FIG. 2, a top heat dissipating device is attached to a top surface of the PCB. For example, a top heat spreader 340 may be attached to a top surface of the PCB 310. The top heat spreader 340 may also be made of any suitable thermally conductive material. For one embodiment of the present invention, the top heat spreader 340 may be made of the same material as the bottom heat spreader 330. For one embodiment of the present invention, the top and bottom heat spreaders may have substantially identical physical dimensions, allowing them to be interchanged, which may reduce the assembly time of the mezzanine card.

For one embodiment of the present invention, the top heat spreader 340 may be thermally coupled with one or more electronic components 318 mounted on the top surface of the PCB 310. For example, the electronic components 318 may comprise optional memory devices mounted on the top surface of the PCB 310. A TIM may be disposed between a backside surface of the electronic components 318 and a bottom surface of the top heat spreader 340, as previously described with reference to the bottom heat spreader 330.

For block 230 of FIG. 2, the top heat dissipating device is thermally coupled with the bottom heat dissipating device through a thermally conductive coupling member. The thermally conductive coupling member may be a variety of shapes and configurations, and may be located at various places along the PCB.

For example, the top heat spreader 340 may be thermally coupled with the bottom heat spreader 330 through a thermally conductive coupling member 350, which may be located along an edge of the PCB 310. The coupling member 350 maybe made of any suitable thermally conductive material. For example, the coupling member 350 may be made of the same material as the bottom heat spreader 330 and/or the top heat spreader 340. As illustrated in the exploded view of FIG. 4, the coupling member 350 may comprise a top portion 352 and a bottom portion 354 which may be integrated with the top heat spreader 340 and the bottom heat spreader 330, respectively. The top portion 352 may mate with the bottom portion 354, for example, when the top and bottom heat spreaders are attached to the PCB 310.

Figure 4:
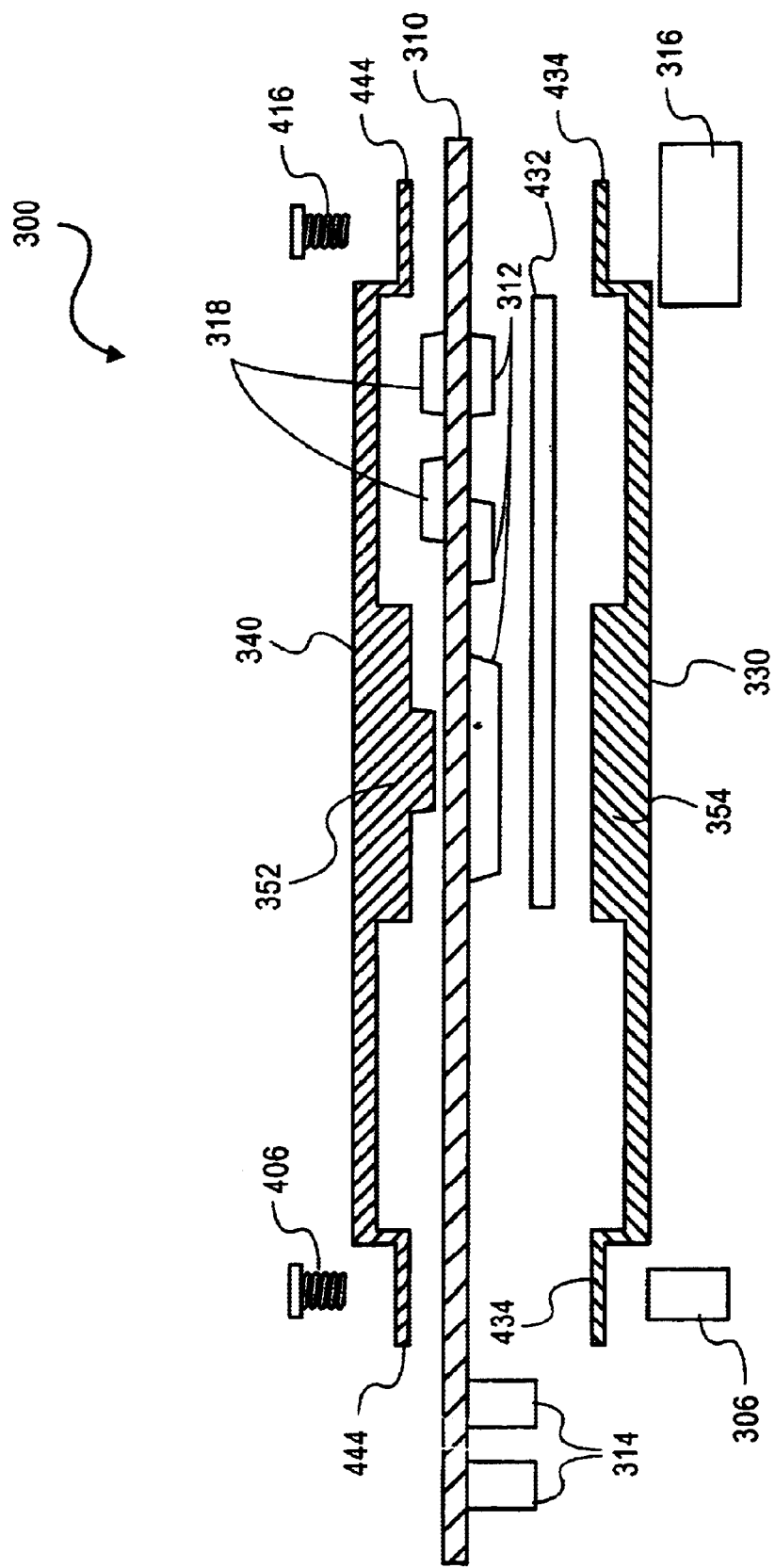
FIG. 4 illustrates an exploded view of an exemplary embodiment of a mezzanine card according to one embodiment of the present invention.

The bottom heat spreader 330 and top heat spreader 340 may be attached to the PCB 310 according to any suitable attachment methods, for example, using general adhesives, thermal adhesives, and/or mechanical clips. For one embodiment of the present invention, as illustrated in FIGS. 3 and 4, the bottom heat spreader 330 and top heat spreader 340 may be attached to the PCB 310 with mounting hardware used to mount the mezzanine card 300 to the carrier board 304.

For example, the top and bottom heat spreaders may have mounting tabs 444 and 434, respectively, with holes (not shown) through which screws 406 and 416 may be inserted to couple with internal threads of the standoffs 306 and the bezel 316, respectively. An advantage to mounting the heat spreaders with the mezzanine card mounting hardware is that the heat spreaders are easily removed, for example, in the case of an upgrade or repair.

For some embodiments of the present invention, the mounting hardware (screws, standoffs, etc.) may be made of a thermally conductive material. Therefore, another advantage to mounting the heat spreaders with the mezzanine card mounting hardware is that thermally conductive mounting hardware may provide additional conductive paths for heat transfer from the bottom heat spreader to the top heat spreader. A thermal interface material (TIM), such as a thermal gel, may be applied to mounting hardware to enhance heat transfer through the mounting hardware. Alternatively, the heat spreaders may be attached to the PCB with rivets or solder, which may also be thermally conductive.

Figure 6:
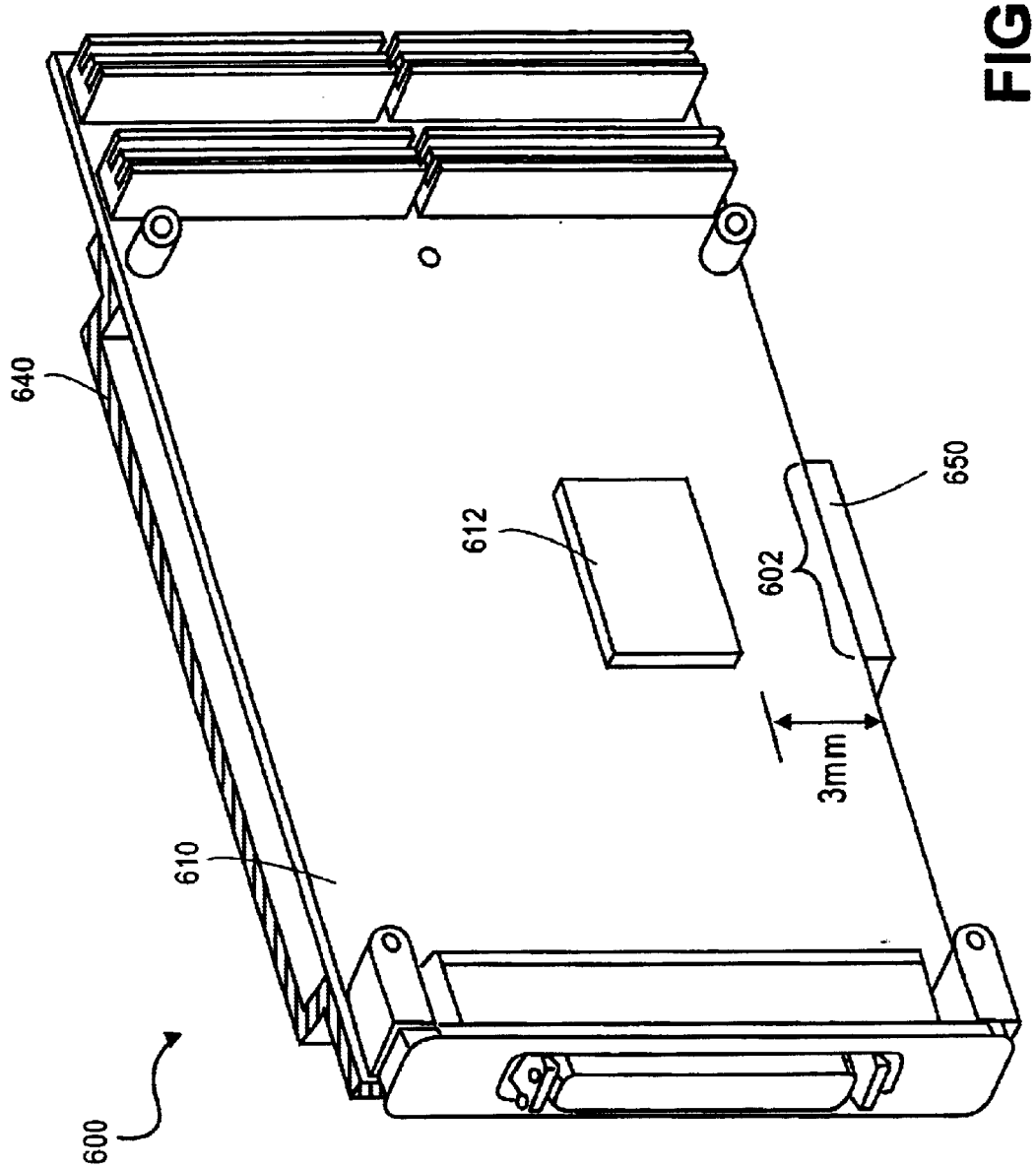
FIG. 6 illustrates a top view of an exemplary embodiment of a mezzanine card according to one embodiment of the present invention.

For some embodiments of the present invention, an electronic component that generates a substantial amount of heat, such as a processor, may be placed near a coupling member in an effort to minimize a path for heat transfer from the electronic component to a top heat spreader. For example, FIG. 6 illustrates a bottom view of a PCB 610 having an electronic component 612 placed within 3 millimeter (mm) of an edge portion 602 of the PCB 610 near a coupling member 650, thermally coupled with a top heat spreader 640. A bottom heat spreader is not shown in FIG. 6 to allow illustration of a bottom surface of the PCB 610.

CONVENTION COOLING

Some embodiments of the present invention may provide improved cooling of a PCB through a combination of conduction and convection cooling. As illustrated in FIG. 3, openings 360 may be formed adjacent to side edges 356 of the coupling member 350. The openings 360 may allow air flow between the top and bottom heat spreaders, which may help cool the PCB 310 of the mezzanine card 300 by convection.

Convection may be governed by the following equation for volume flow rate (Vrate) of air through the area of the openings 360:

$$\text{Vrate} = v * h * (X1 - X2)$$

where "v" is the velocity of the air, "h" and "X2" are a height and length of the coupling member 350, respectively, and "X1" is a length of the top and bottom heat spreaders. For one embodiment of the present invention, the length X1 of the top and bottom heat spreaders may be between 100 and 140 mm, while the length X2 of the coupling member 350 may be between 25 and 50 mm.

Conduction through the coupling member 350 may be governed by the following equation for conductive transfer of heat (Q) dissipated by the PCB:

$$Q=K*t*X2*(T1-T2)$$

where, K is a thermal conductivity of the coupling member 350, t is a thickness of the coupling member 350, T1 and T2 are temperatures of the bottom heat spreader 330 and top heat spreader 340, respectively. Q may be determined by the power dissipation of the PCB, which may be in the range of 5 to 20 W.

It may be seen from the governing equations for convection and conduction that while decreasing the length X2 of the coupling member 350 may increase convection, it may also decrease conduction. For example, with no coupling member (X2=0), there may be maximum convection, but no conductive path from the bottom heat spreader 330 to the top heat spreader 340. Alternatively, if the length X2 of the coupling member is equal to the length X1 of the top and bottom heat spreaders, there may be no openings 360 and, hence, no air flow (Vrate=0).

OPTIMIZING DIMENSIONS OF THE COUPLING MEMBER

Because a mezzanine system may be packaged in a small enclosure, without room for a cooling fan, the velocity of air may be limited to free air convection, which may be in the range of 0.1 to 0.15 m/s. Optimizing the dimensions of the coupling member may allow mezzanine cards with high power processors to be sufficiently cooled by the small amount of air flow generated by free air convection.

For example, it may be seen from the governing equation for conduction listed above, that if Q, K and t are held constant, different values of X2 may produce different values for the temperature T1 of the bottom heat spreader and the temperature T2 of the top heat spreader. Therefore, for some embodiments of the present invention, X2 may be optimized in an effort to maintain the temperature of the bottom heat spreader T1 below a target temperature.

Figure 7:
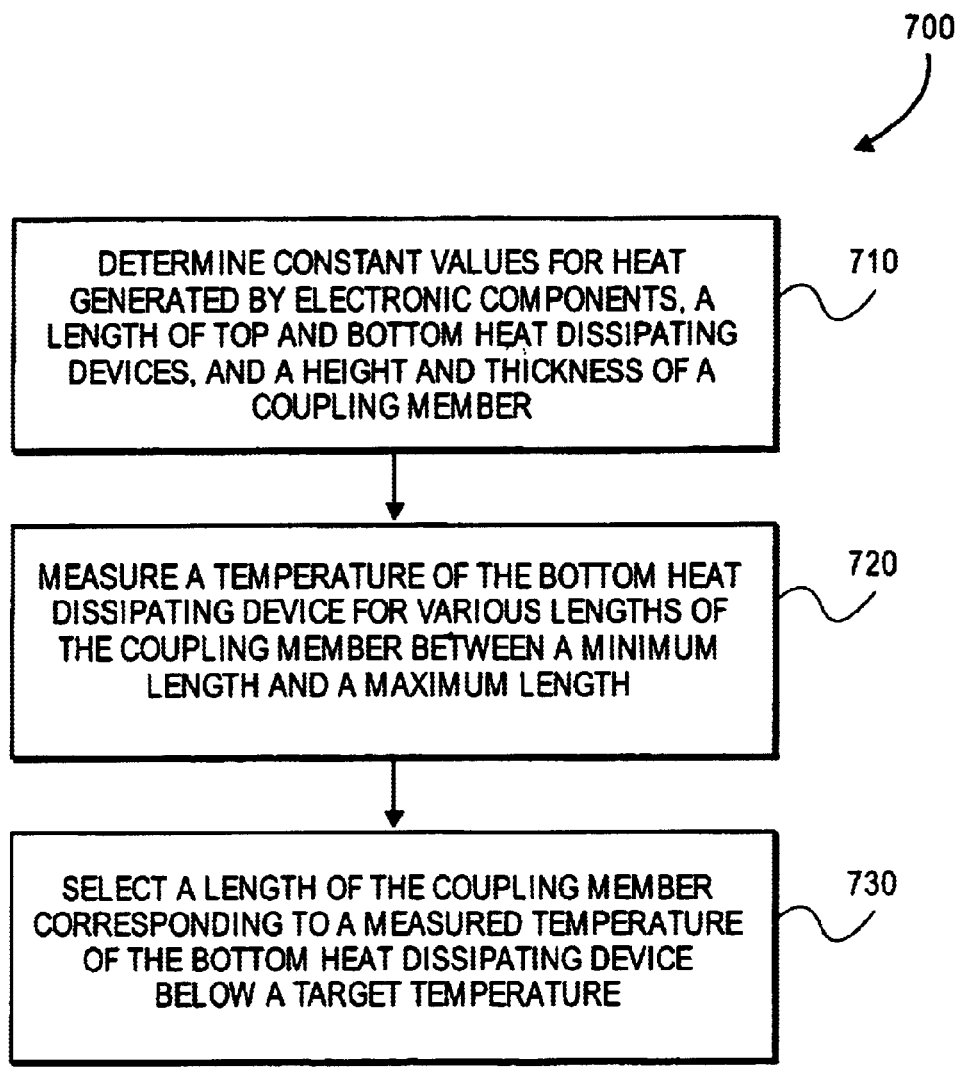
FIG. 7 illustrates a flow diagram of an exemplary method to optimize coupling member dimensions according to one embodiment of the present invention.

For example, FIG. 7 illustrates a flow diagram 700 of a method of optimizing a length (X2) of a coupling member according to one embodiment of the present invention. FIG. 7 may be described with reference to the exemplary mezzanine card 300 illustrated in FIG. 3. The operations of flow diagram 700 may be easily modified to optimize other dimensions, such as the thickness (t) of the coupling member, the height (h) of the coupling member and/or a length (X1) of top and bottom heat spreaders.

For block 710, constant values are determined for heat generated by electronic components, a length of top and bottom heat dissipating devices, and a thickness and height of a coupling member. For example, the heat generated by the electronic components 312 mounted on the bottom surface of the PCB 310 of the mezzanine card 300 may be determined by power dissipation of the mezzanine card, which may be in the range of 5 to 15 W, with over 5 W generated by a processor alone. The length X1 of the top and bottom heat spreaders 340 and 330 may be determined by the location of the mounting hardware.

For block 720, a temperature of the bottom heat dissipating device is measured for various lengths of the coupling member between a minimum and a maximum value. For example, the actual temperature of the bottom heat spreader 330 may be measured by experimentation while operating the mezzanine card 300. Alternatively, the temperature of the bottom heat spreader 330 may be measured by simulation. For example, the mezzanine card 300 may be modeled using any suitable simulation tools, such as ICEPAK electronics cooling modeling software available from Fluent Inc., of Lebanon, N.H. Such simulation tools may produce accurate results by performing simulations with accurate component packaging and wattages, as well as material properties for the PCB, heat spreaders and coupling member.

For block 730, a length of the coupling member corresponding to a measured temperature of the bottom heat dissipating device below a target temperature is chosen. As previously described, the target temperature may correspond to a maximum operating temperature of the electronic components 312. For example, with approximate constant values of Q=10W, h=5.6 mm, t=2 mm, and X1=127 mm, an optimum value for X2 may be approximately 38 mm to keep the temperature of the bottom heat spreader 330 below a target temperature of 95° C.

Figure 8:
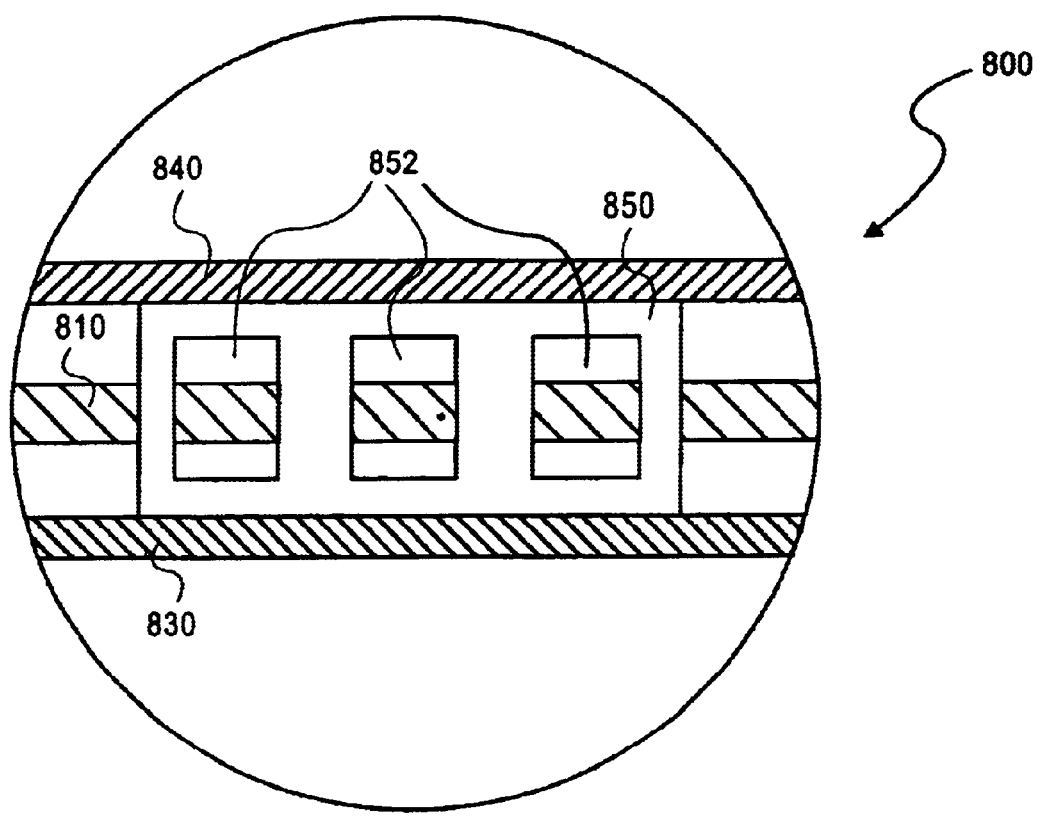
FIG. 8 illustrates a side view of an exemplary embodiment of a coupling member according to one embodiment of the present invention.

For some embodiments of the present invention, openings may be formed in the coupling member itself in an effort to enhance convection. For example, FIG. 8 illustrates a side view 800 of a coupling member 850 with openings 852 formed therein, which may allow air flow through a bottom heat spreader 830 and a top heat spreader 840. Dimensions of the coupling member 850 and the openings 852 may be optimized for conduction and convection cooling, as previously described.

For some embodiments of the present invention, multiple thermally conductive coupling members may be used to thermally couple top and bottom heat dissipating devices. For example, multiple coupling members may be placed adjacent to each other, or along opposing edges of a PCB. For some embodiments of the present invention, a PCB may have an opening, or cut-out, to accommodate placement of a coupling member perpendicular to the PCB, or even in the middle of the PCB. A cut-out in the PCB, however, may reduce a signal routing area of the PCB, which may increase complexity of signal routing. Further, various mezzanine card standards may prohibit cut-out areas along the PCB.

COMMON MEZZANINE CARD (CMC) STANDARD ENVELOPE

For example, the Institute of Electrical and Electronics Engineers (IEEE) Standard for a Common Mezzanine Card Family: CMC, IEEE STD P1386 (the IEEE 1386 standard), published on Jun. 14, 2001, defines physical dimensions for common mezzanine cards, such as PCI mezzanine cards (PMCs). Compliance with a mezzanine card standard, such as the IEEE 1386 standard, may enhance sales of a mezzanine card by ensuring its compatibility with mezzanine systems manufacturers by various vendors.

The IEEE 1386 standard specifies a volumetric envelope which defines a space that may be occupied by a mezzanine card including the PCB, associated electronic components, and a minimum cooling gap. The total mezzanine card envelope may be divided into two parts, the input/output (I/O) envelope and the component envelope. The I/O envelope defines where I/O connectors may be mounted on the mezzanine card bezel. The component envelope defines where electronic components and the printed circuit board may be placed. Because some mezzanine cards may not have I/O connectors, components may be placed in the I/O envelope.

Figure 9:
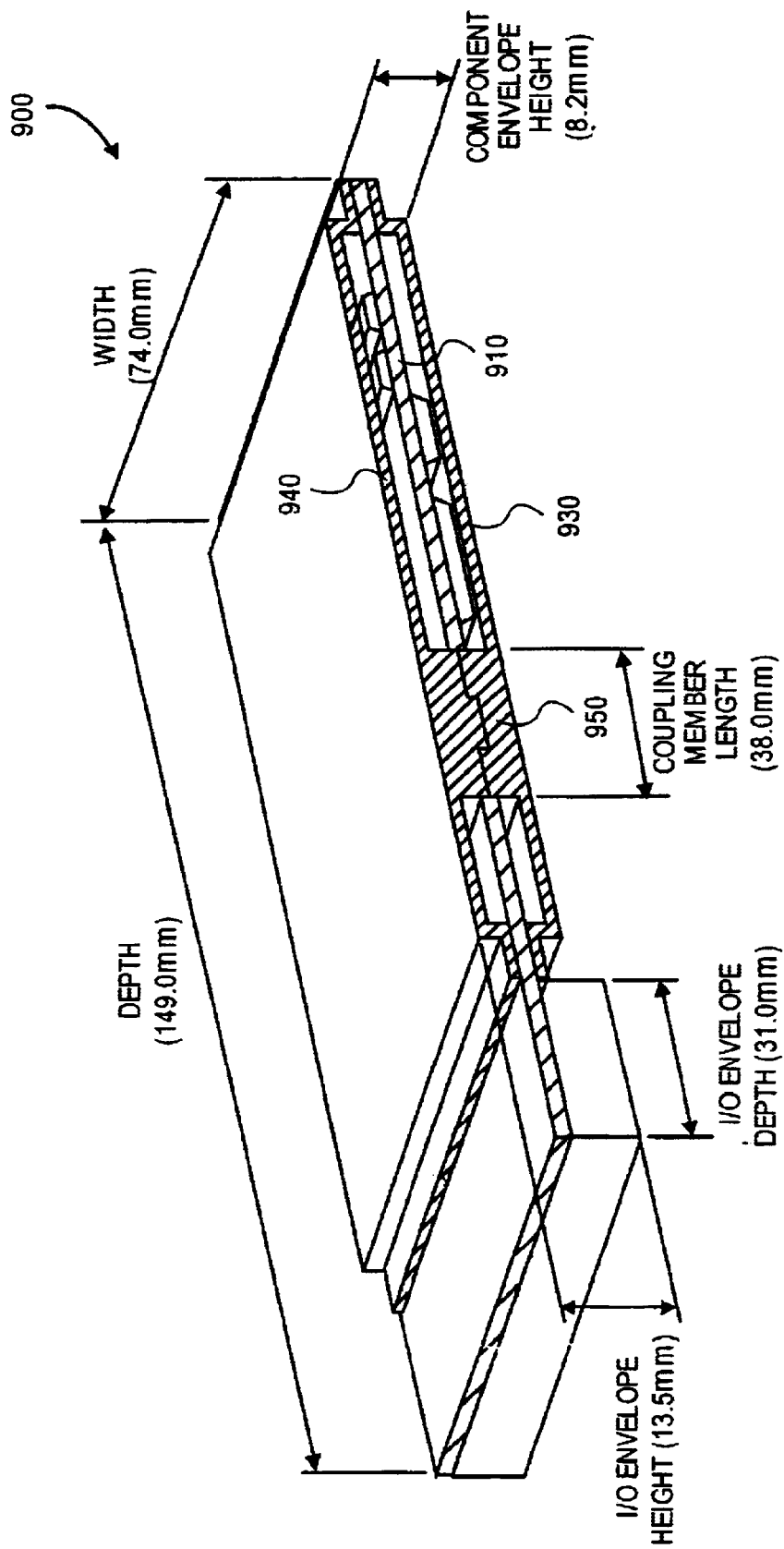
FIG. 9 illustrates an exemplary volumetric envelope of a mezzanine card assembly according to one embodiment of the present invention.

FIG. 9 illustrates a mezzanine card 900 in accordance with the IEEE 1386 standard, having a standard width of 74 mm, and a standard depth of 149 mm. The I/O envelope has a standard height of 13.5 mm and a standard depth of 31.0 mm, while the component envelope has a standard height of 8.2 mm. As illustrated, for one embodiment of the present invention, a PCB 910, a bottom heat spreader 930, a top heat spreader 940, and a coupling member 950 may fit within the standard component envelope height of 8.2 mm. As previously described, the coupling member 950 may have a length of approximately 38 mm (with a width of 2 mm) to provide a balance between conduction and convection. Other embodiments of the present invention may be in accordance with standards other than the IEEE 1386 standard, which may define different volumetric envelopes. Therefore, the above described dimensions may be modified accordingly.

In the foregoing description, the invention has been described with reference to specific exemplary embodiments thereof. It will, however, be evident that various modifications and changes may be made thereto without departing from the broader spirit or scope of the present invention as defined in the appended claims. For example, while the foregoing detailed description referred to mezzanine cards in detail, it should be understood that the present invention may be applied to other types of PCB assemblies, such as memory cards, network cards, other types of expansion cards, etc. The specification and drawings are, accordingly, to be regarded in an illustrative rather than a restrictive sense.

What is claimed is:

1. An apparatus comprising:
   a printed circuit board (PCB) having a top surface and a bottom surface;
   at least one electronic component, having a backside surface, mounted on the bottom surface of the PCB;
   a bottom heat dissipating device, having a bottom coupling portion, attached to the bottom surface of the PCB, a top surface thereof thermally coupled to the backside surface of the electronic component; and
   a top heat dissipating device, having a top coupling portion, attached to the top surface of the PCB, the top coupling portion contacting the bottom coupling portion, the bottom and top coupling portions jointly forming a thermally conductive coupling member being thermally coupled to the bottom and top heat dissipating devices at least one of the heat dissipating devices having recessed areas of different depths to thermally couple with electronic components of different heights.

2. The apparatus of claim 1, wherein the apparatus is a mezzanine card.

3. The apparatus of claim 2, wherein the top and bottom heat dissipating devices are heat spreaders with lengths between 100 and 140 millimeters.

4. The apparatus of claim 3, wherein a height from a bottom surface of the bottom heat spreader to a top surface of the top heat spreader is 8.2 millimeters or less.

5. The apparatus of claim 3, wherein the one or more electronic components mounted on the bottom surface of the PCB comprise a processor.

6. The apparatus of claim 5, wherein the thermally conductive coupling member extends along an edge portion of the PCB, and the processor is mounted within 3 millimeters from said edge portion.

7. The apparatus of claim 1, wherein the thermally conductive coupling member comprises a top portion and a bottom portion, wherein the top portion is integral with the top heat dissipating device and/or the bottom portion is integral with the bottom heat dissipating device.

8. The apparatus of claim 1, further comprising at least one other thermally conductive coupling member thermally coupled with the bottom and top heat dissipating devices.

9. The apparatus of claim 1, wherein the bottom heat dissipating device and/or the top heat dissipating device are made substantially of copper or a copper alloy.

10. The apparatus of claim 1, wherein a bottom surface of the top heat dissipating device is thermally coupled with one or more electronic devices mounted on the top surface of the PCB.

11. The apparatus of claim 1, wherein the top and bottom heat dissipating devices are attached to the PCB with thermally conductive mounting hardware, said mounting hardware thermally coupled with the top and bottom heat dissipating devices.

12. The apparatus of claim 11, wherein the thermally conductive mounting hardware comprises one or more screws.

13. The apparatus of claim 1, wherein the thermally conductive coupling member extends partially adjacent a side edge of the PCB between the top and bottom heat dissipating devices.

14. The apparatus of claim 13, wherein lengths of the top and bottom heat dissipating devices extending along the edge of the PCB are between 100 and 140 millimeters and a length of the thermally conductive coupling member extending along the edge is between 25 and 50 millimeters.

15. The apparatus of claim 1, wherein the thermally conductive coupling member extends along an edge of the PCB with at least one opening formed within the thermally conductive coupling member.

16. A system comprising:
    a carrier board having a bus; and
    a mezzanine card mounted on the carrier board coupled with the bus, the mezzanine card comprising a printed circuit board (PCB), a bottom heat dissipating device attached to a bottom surface of the PCB facing the carrier board, a top surface of the bottom heat dissipating device thermally coupled with a backside surface of one or more electronic components mounted on the bottom surface of the PCB, a top heat dissipating device attached to a top surface of the PCB, and a thermally conductive coupling member thermally coupled with the bottom and top heat dissipating device, the thermally conductive coupling member having a portion integral with at least one of the heat dissipating devices and being adjacent to the other heat dissipating device, the thermally conductive coupling member having a length being between 17 and 50 percent of a length of one of the heat dissipating devices.

17. The system of claim 16, wherein the top and bottom heat dissipating devices are heat spreaders having a length between 100 and 140 millimeters.

18. The system of claim 16, wherein a height from a top surface of the carrier board to a top surface of the top heat dissipating device is 13.5 millimeters or less.

19. The system of claim 16, wherein the bottom heat dissipating device and/or the top heat dissipating device have recessed areas of different depths to thermally couple with electronic components of different heights.

20. The system of claim 16, wherein the top and bottom heat dissipating devices are attached to the PCB with thermally conductive mounting hardware also used to mount the mezzanine card to the carrier board, said mounting hardware thermally coupled with the top and bottom heat dissipating devices.

21. The system of claim 16, wherein the thermally conductive coupling member extends partially adjacent to a side edge of the PCB between the top and bottom heat dissipating devices.

22. The system of claim 21, wherein lengths of the top and bottom heat dissipating devices extending along the edge of the PCB are between 100 and 140 millimeters and a length of the thermally conductive coupling member extending along the edge is between 25 and 50 millimeters.

* * * * *